(12) United States Patent
Yi

(10) Patent No.: US 7,541,259 B2
(45) Date of Patent: Jun. 2, 2009

(54) SEMICONDUCTOR DEVICE HAVING A COMPRESSED DEVICE ISOLATION STRUCTURE

(75) Inventor: Jae Yun Yi, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 164 days.

(21) Appl. No.: 11/647,327

(22) Filed: Dec. 29, 2006

(65) Prior Publication Data

US 2008/0017929 A1    Jan. 24, 2008

(30) Foreign Application Priority Data

Jul. 24, 2006    (KR) .................... 10-2006-0069206
Dec. 11, 2006   (KR) .................... 10-2006-0125688

(51) Int. Cl.
  *H01L 21/76*    (2006.01)
(52) U.S. Cl. .................. 438/431; 438/221; 438/424; 438/435; 257/E21.002
(58) Field of Classification Search ............... 438/221, 438/424, 431, 435
See application file for complete search history.

(56) References Cited

U.S. PATENT DOCUMENTS

| | | | | |
|---|---|---|---|---|
| 6,717,216 B1 * | 4/2004 | Doris et al. | ............... | 257/347 |
| 7,256,081 B2 * | 8/2007 | Yang et al. | ............... | 438/184 |
| 7,301,205 B2 | 11/2007 | Matsumori | | |
| 7,381,609 B2 * | 6/2008 | Yang et al. | ............... | 438/218 |
| 2005/0233540 A1 * | 10/2005 | Yoon et al. | ............... | 438/424 |
| 2006/0121688 A1 | 6/2006 | Ko et al. | | |
| 2006/0220142 A1 | 10/2006 | Tamura | | |

FOREIGN PATENT DOCUMENTS

| | | |
|---|---|---|
| KR | 1019970008482 B1 | 5/1997 |
| KR | 1998-084173 | 12/1998 |
| KR | 1020060000483 A | 1/2006 |
| WO | WO 98/43293 | 10/1998 |

\* cited by examiner

*Primary Examiner*—N Drew Richards
*Assistant Examiner*—Christy L Novacek
(74) *Attorney, Agent, or Firm*—Townsend and Townsend and Crew LLP

(57) ABSTRACT

The semiconductor device includes a lower device isolation structure formed in a semiconductor substrate to define an active region. The lower device isolation structure has a first compressive stress. An upper device isolation structure is disposed over the lower device isolation structure. The upper device isolation structure has a second compressive stress greater than the first compressive stress. A gate structure is disposed over the active region between the neighboring upper device isolation structures.

32 Claims, 9 Drawing Sheets

SEMICONDUCTOR DEVICE HAVING A COMPRESSED DEVICE ISOLATION STRUCTURE

CROSS-REFERENCES TO RELATED APPLICATIONS

The present application claims priority to Korean patent application numbers 10-2006-0069206 and 10-2006-0125688, respectively filed on Jul. 24, 2006 and on Dec. 11, 2006, which are incorporated by references in their entireties.

BACKGROUND OF THE INVENTION

The present invention relates to a memory device. More particularly, the present invention relates to a semiconductor device having a modified device isolation structure with improved carrier mobility and a method for its fabrication.

Generally, integrated circuit ("IC") makers have reduced the size of device in order to increase operating speed of the device such as transistors constituting IC. Although the shrunk device may be operated high-speedily, there is an adverse effect to the transistor's performance, which is called to the Short Channel Effect ("SCE") such as the decrease in breakdown voltage of source/drain regions, the increase in junction capacitance, and the instability of critical voltage.

The technique of increasing operating speed of the device has changed from reducing the size of the device to improving the carrier mobility of a transistor and reducing the SCE of the device. The carrier mobility of the transistor can be improved by straining the semiconductor devices. When stress is applied to a transistor in order to improve the operating characteristics of an n-type Metal Oxide Semiconductor ("NMOS") transistor and a p-type Metal Oxide Semiconductor ("PMOS") transistor, tensile stress and compressive stress are applied along the channel direction of the device, respectively. First, there was an attempt to improve the carrier mobility by applying different stress according to kind of transistor. That is, the stress can be adjusted according to the deposition material and deposition condition for the gate spacer in the formation of the gate spacer. However, since the gate material has changed from a 'hard' tungsten silicide layer to a 'soft' tungsten layer, the gate material plays a role of a buffer against stress applied to the gate structure. As a result, it is difficult to apply the desired stress to the transistor. In addition, there is a huge cost to improve the carrier mobility of the device by using silicon germanium source/drain regions or using a Silicon-on-Insulator ("SOI") substrate.

BRIEF SUMMARY OF THE INVENTION

Embodiments of the present invention are directed to semiconductor devices having a modified device isolation structure with improved carrier mobility. According to one embodiment, the modified device isolation structure has a stacked structure of an upper device isolation structure and a lower device isolation structure, in which compressive stress of the upper device isolation structure is greater than that of the lower device isolation structure.

In one embodiment of the present invention, a semiconductor device comprises: a lower device isolation structure formed in a semiconductor substrate to define an active region, the lower device isolation structure having a first compressive stress; an upper device isolation structure disposed over the lower device isolation structure, the upper device isolation structure having a second compressive stress greater than the first compressive stress; and a gate structure disposed over the active region between the neighboring upper device isolation structures.

In one embodiment, a semiconductor device comprises: a lower device isolation structure formed in a semiconductor substrate having a PMOS region and a n-type Metal Oxide Semiconductor ("NMOS") region to define an active region, the lower device isolation structure having a first compressive stress; a P-upper device isolation structure disposed over the lower device isolation structure in the PMOS region, the P-upper device isolation structure having a second compressive stress greater than the first compressive stress; and a N-upper device isolation structure disposed over the lower device isolation structure in the NMOS region, the N-upper device isolation structure having a third compressive stress less than the first compressive stress.

According to another embodiment of the present invention, a method for fabricating a semiconductor device includes: forming a device isolation structure in a semiconductor substrate to define an active region; etching a given thickness of the device isolation structure to form a recess defining a lower device isolation structure having a first compressive stress; forming a gate conductive layer and a gate hard mask layer over the semiconductor substrate including the recess; patterning the gate hard mask layer and the gate conductive layer by using a gate mask to form a gate structure over the semiconductor substrate, wherein a given thickness of the gate conductive layer remains over the lower device isolation structure; and oxidizing the remaining gate conductive layer to form an upper device isolation structure having a second compressive stress greater than the first compressive stress.

In another embodiment, a method for fabricating a semiconductor device includes: forming a device isolation structure in a semiconductor substrate having a PMOS region and a NMOS region to define an active region; etching a given thickness of the device isolation structure to form a recess defining a lower device isolation structure having a first compressive stress; forming a gate conductive layer and a gate hard mask layer over the semiconductor substrate including the recess; patterning the gate hard mask layer and the gate conductive layer by using a gate mask to form a gate structure over the semiconductor substrate, wherein the gate conductive layer remains over the lower device isolation structure; etching a given thickness of the remaining gate conductive layer over the lower device isolation structure; and oxidizing the gate conductive layer over the lower device isolation structure to form an upper device isolation structure in the PMOS region having a second compressive stress greater than the first compressive stress.

DESCRIPTION OF SPECIFIC EMBODIMENTS

The present invention relates to semiconductor devices having modified device isolation structure with improved carrier mobility and a method for fabricating the same. The modified device isolation structure has a stacked structure of an upper device isolation structure and a lower device isolation structure with different compressive stresses. That is, the compressive stress of the upper device isolation structure in a PMOS region is greater than that of the lower device isolation structure. In addition, the compressive stress of the upper device isolation structure in a NMOS region is less than that of the lower device isolation structure. Accordingly, the modified device isolation structure provides the improved carrier mobility of the device due to applying different stress to the NMOS transistor and the PMOS transistor.

Figure 1:
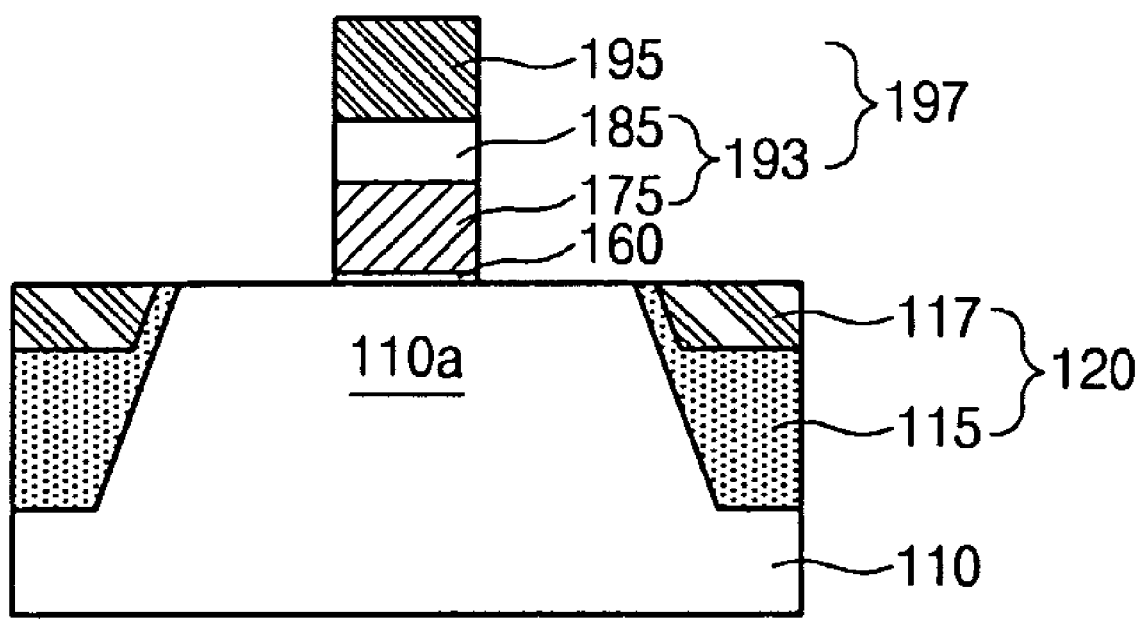
FIG. 1 is a simplified cross-sectional view of a semiconductor device according to one embodiment of the present invention.

FIG. 1 is a simplified cross-sectional view of a semiconductor device according to one embodiment of the present invention. The semiconductor device includes a device isolation structure 120 and a gate structure 197. The device isolation structure 120 including a stacked structure of a lower device isolation structure 115 and an upper device isolation structure 117 is formed in a semiconductor substrate 110 to define an active region 110a. The gate structure 197 including a stacked structure of a gate electrode 193 and a gate hard mask layer pattern 195 is disposed over the active region 110a. In addition, a gate insulating film 160 is disposed between the gate structure 197 and the underlying active region 110a. In one embodiment of the present invention, the upper device isolation structure 117 is formed of a poly-oxide film, which has relatively greater compressive stress than that of a conventional device isolation structure such as a High Density Plasma ("HDP") oxide film. As a result, the compressive stress provided from the upper device isolation structure 117 is applied to the semiconductor substrate 110 under the gate structure 197, thereby improving the carrier mobility of the device. In addition, the semiconductor substrate 110 is in a PMOS region. In another embodiment, the lower device isolation structure 115 is selected from the group consisting of a Spin-on-Dielectric ("SOD") oxide film, a HDP oxide film, and combination thereof. In order to improve the gap-fill characteristics, the lower device isolation structure 115 includes a stacked structure of a SOD oxide film and a HDP oxide film.

Figure 2:
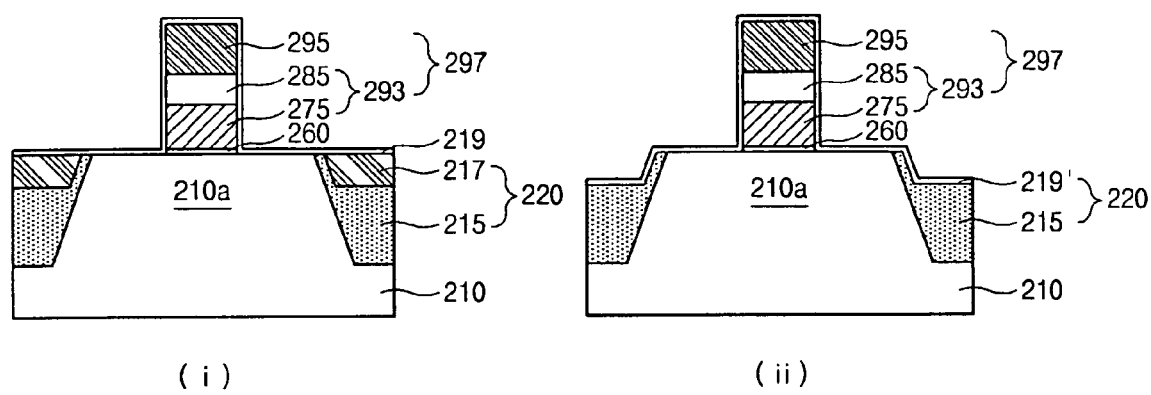
FIG. 2 is a simplified cross-sectional view of a semiconductor device according to another embodiment of the present invention.

FIG. 2 is a simplified cross-sectional view of a semiconductor device according to another embodiment of the present invention, wherein FIG. 2(i) is a cross-sectional view in a PMOS region and FIG. 2(ii) is a cross-sectional view in a n-type Metal Oxide Semiconductor ("NMOS") region. A semiconductor device includes a device isolation structure 220, a gate insulating film 260, and a gate structure 297. The device isolation structure 220 is formed in a semiconductor substrate 210 having the PMOS region and the NMOS region to define an active region 210a. The gate structure 297 including a stacked structure of a gate electrode 293 and a gate hard mask layer pattern 295 is disposed over the active region 210a. The gate insulating film 260 is disposed between the gate structure 297 and the underlying the active region 210a. In one embodiment of the present invention, the device isolation structure 220 in the PMOS region includes a stacked structure of a lower device isolation structure 215 and an upper device isolation structure 217. The upper device isolation structure 217 in the PMOS region is formed of a poly-oxide film, which has relatively greater compressive stress than that of the conventional device isolation structure such as a HDP oxide film. As a result, the compressive stress provided from the upper device isolation structure 217 is applied to the semiconductor substrate 210 under the gate structure 297, thereby improving the carrier mobility of the device. In the NMOS region, the device isolation structure 220 includes the lower device isolation structure 215 and the upper device isolation structure 219'. The upper device isolation structure 219' in the NMOS region is formed of a nitride film, which has relatively less compressive stress than that of the conventional device isolation structure such as a HDP oxide film or that of the upper device isolation structure 217 in the PMOS region. As a result, the compressive stress provided from the upper device isolation structure 219 is relieved at the semiconductor substrate 210 under the gate structure 297 in the NMOS region. Accordingly, the carrier mobility of the device can be simultaneously improved in the PMOS region and the NMOS region. In another embodiment, a thickness of the upper device isolation structure 217 in the PMOS region ranges from about 50 Å to about 300 Å. In addition, the lower device isolation structure 215 is selected from the group consisting of a SOD oxide film, a HDP oxide film, and combination thereof. In order to improve the gap-fill characteristics, the lower device isolation structure 215 includes a stacked structure of a SOD oxide film and a HDP oxide film.

Figure 3A:
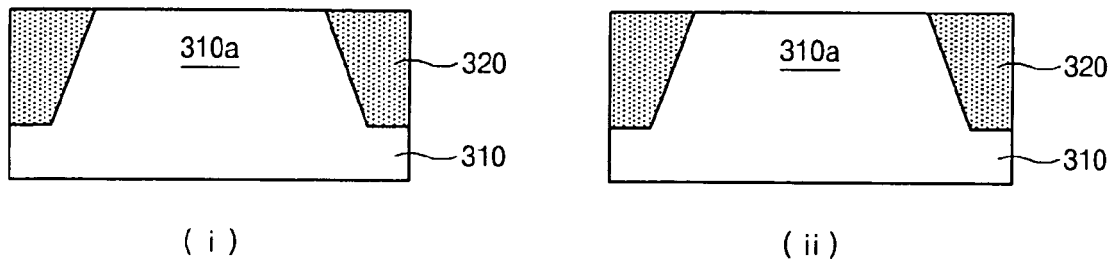
FIGS. 3a through 3f are simplified cross-sectional views illustrating a method for fabricating a semiconductor device according to one embodiment of the present invention.

FIGS. 3a through 3f are simplified cross-sectional views illustrating a method for fabricating a semiconductor device according to one embodiment of the present invention, wherein FIGS. 3a(i) through 3f(i) are cross-sectional views in the PMOS region and FIGS. 3a(ii) through 3f(ii) are cross-sectional views in the NMOS region. A trench (not shown) for device isolation is formed in a semiconductor substrate 310 having a pad insulating film (not shown) by a Shallow Trench Isolation ("STI") method. The semiconductor substrate 310 includes the PMOS region and the NMOS region. An insulating film (not shown) for device isolation is formed over an entire surface of the resultant (i.e. over the trench and the semiconductor substrate 310) to fill the trench for device isolation. The insulating film for device isolation is polished until the pad insulating film is exposed to form a device isolation structure 320 defining an active region 310a. In one embodiment of the present invention, the insulating film for device isolation is selected from the group consisting of a SOD oxide film, a HDP oxide film, and combination thereof. In order to improve the Gap-fill characteristics, the insulating film for device isolation comprises a stacked structure of a SOD oxide film and a HDP oxide film. The SOD oxide film is formed by a Spin-fill method.

Figure 3B:
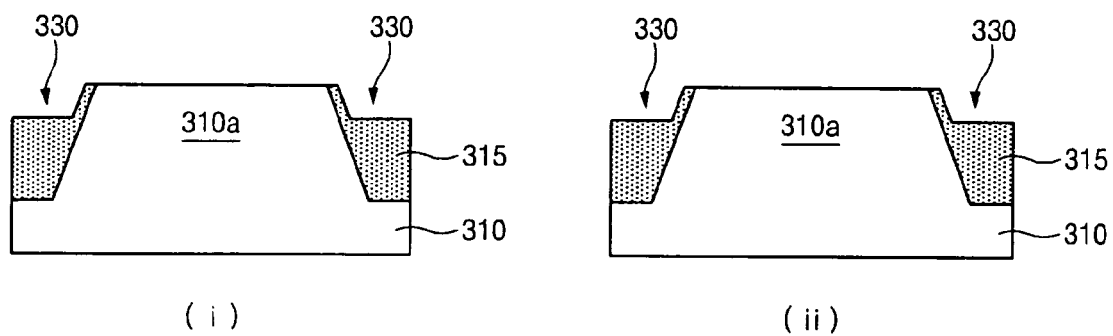
Figure 3C:
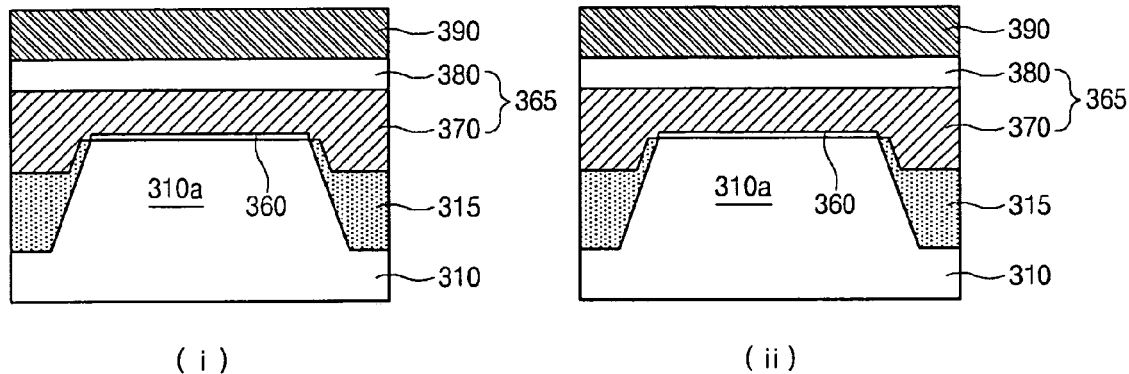

Referring to FIGS. 3b and 3c, a given thickness of the device isolation structure 320 is etched to form a recess 330 defining a lower device isolation structure 315. the pad insulating film is removed to expose the semiconductor substrate 310. A gate insulating film 360 is formed over the exposed semiconductor substrate 310. A gate conductive layer 365 is formed over an entire surface of the resultant including the recess 330 (i.e. over the lower device isolation structure 315 and the gate insulating film 360). A gate hard mask layer 390 is formed over the gate conductive layer 365. In one embodiment of the present invention, the given thickness of the etched device isolation structure 320 ranges from about 10 Å to about 2,000 Å. In addition, the gate conductive layer 365 comprises a stacked structure of a lower gate conductive layer 370 and an upper gate conductive layer 380. The lower gate conductive layer 370 is formed of a polysilicon layer. The upper gate conductive layer 380 is selected from the group consisting of a titanium (Ti) layer, a titanium nitride (TiN) film, a tungsten (W) layer, an aluminum (Al) layer, a copper (Cu) layer, a tungsten silicide ($WSi_x$) layer, and combinations thereof.

Figure 3D:
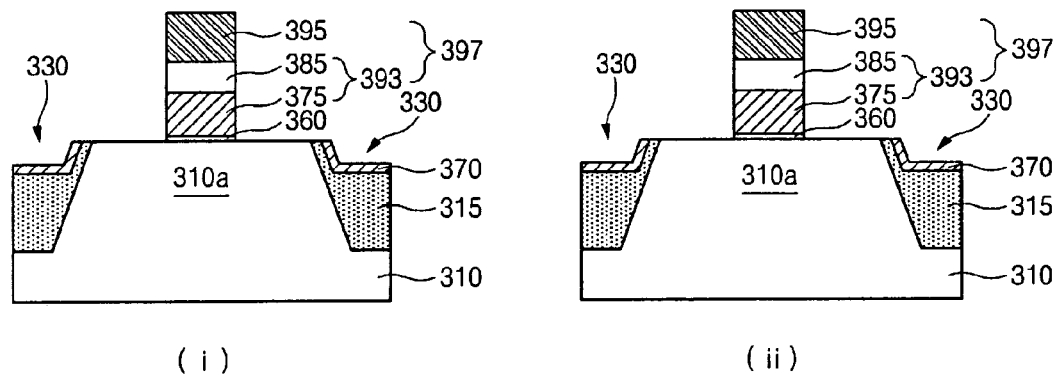
Figure 3E:
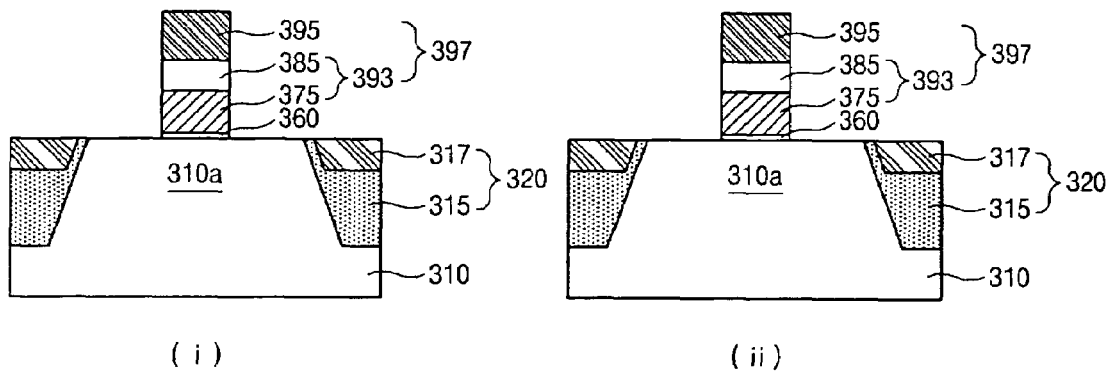

Referring to FIGS. 3d and 3e, the gate hard mask layer 390 and the gate conductive layer 365 are patterned using a gate mask (not shown) to form a gate structure 397 including a stacked structure of a gate hard mask layer pattern 395 and a gate electrode 393. During the process for forming the gate structure 397, the remaining gate conductive layer 370 over the lower device isolation structure 315 is separated from the gate electrode 393. Sidewalls of the gate structure 397 and the remaining gate conductive layer 370 over the lower device isolation structure 315 are oxidized to form an upper device isolation structure 317. In one embodiment of the present invention, an etch selectivity of the gate conductive layer 370 is adjusted to obtain a relatively thin thickness of the remaining gate conductive layer 370 over the lower device isolation structure 315. As a result of the remaining thin gate conductive layer 370 over the lower device isolation structure 315, the oxidized gate conductive layer 370 in the subsequent oxidizing process is not protruded over the active region 310a. In addition, the upper device isolation structure 317 is formed of a poly-oxide film with increased volume to apply compressive stress provided from the upper device isolation structure 317 to the semiconductor substrate 310 under the gate structure 397. As a result of the compressive stress, the carrier mobility of the transistor is improved in the PMOS region. Accordingly, the operation characteristics of the transistor can be improved.

Figure 3F:
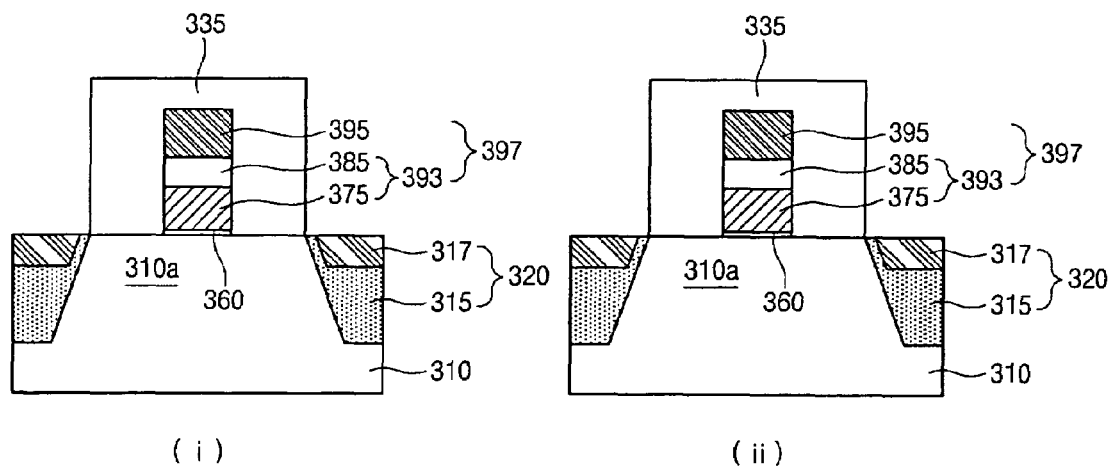

Referring to FIG. 3f, a photoresist film (not shown) is formed over an entire surface of the resultant (i.e. over the semiconductor substrate 310 and the device isolation structure 320 in the PMOS region and the NMOS region). The photoresist film is exposed and developed using the gate mask to form a photoresist film pattern 335 exposing the upper device isolation structure 317. The exposed upper device isolation structure 317 may further be oxidized in order to increase the volume of the upper device isolation structure 317. In one embodiment of the present invention, the photoresist film is formed of a negative photoresist film.

Figure 4A:
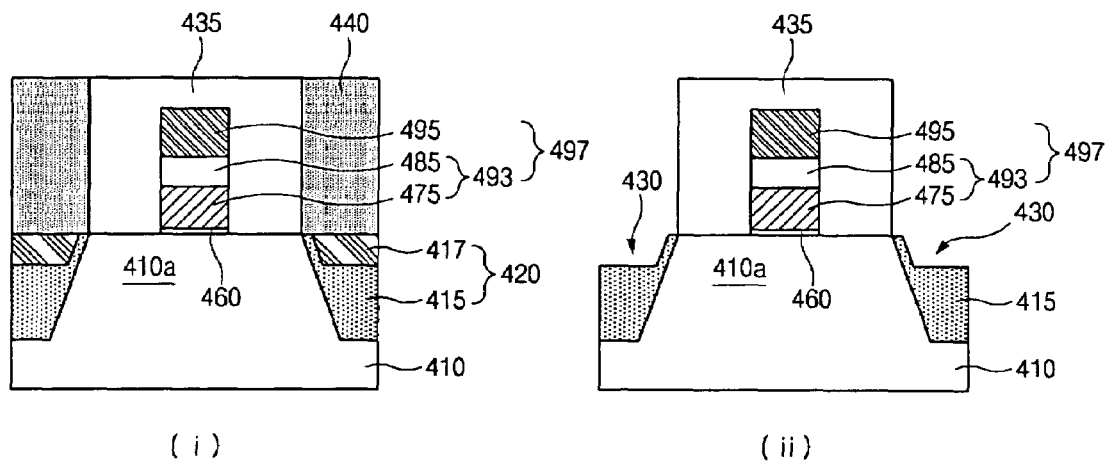
FIGS. 4a and 4b are simplified cross-sectional views illustrating a method for fabricating a semiconductor device according to another embodiment of the present invention.
Figure 4B:
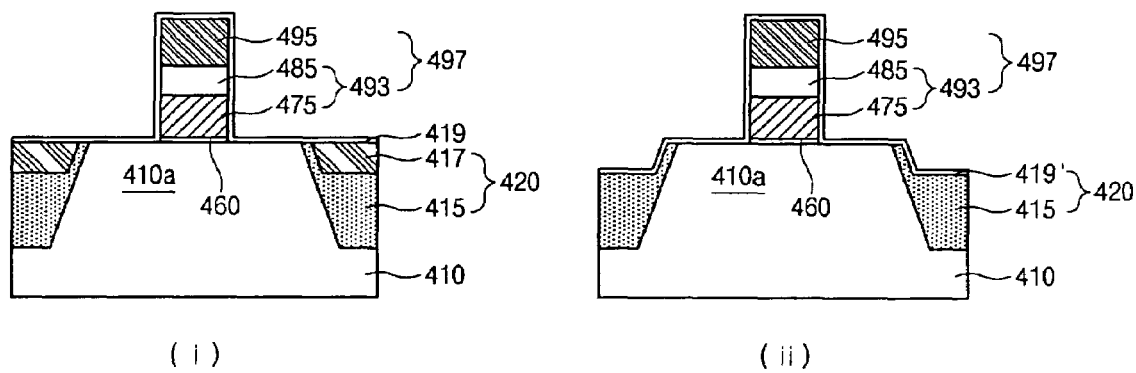

FIGS. 4a and 4b are simplified cross-sectional views illustrating a method for fabricating a semiconductor device according to another embodiment of the present invention. Here, FIGS. 4a(i) and 4b(i) are cross-sectional views in the PMOS region, and FIGS. 4a(ii) and 4b(ii) are cross-sectional views in the NMOS region.

Referring to FIGS. 4a and 4b, a photoresist film (not shown) is formed over the resulting structure shown in FIG. 3f. The photoresist film is exposed and developed using a mask defining the NMOS region to form a photoresist film pattern 440 exposing the NMOS region. The upper device isolation structure 317 shown in FIG. 3f exposed in the NMOS region is removed to form a recess 430 defining the lower device isolation structure 415 in the NMOS region. The photoresist film pattern 440 covering the PMOS region and the photoresist film pattern 435 covering the active region 410a are removed. An insulating film 419 is formed over an entire surface of the resultant including the recess 430 (i.e. over the gate structure 497, the active region 410a, and the device isolation structure 420 in the PMOS region and the NMOS region) to form the upper device isolation structure 419' in the NMOS region. In one embodiment of the present invention, the upper device isolation structure 419' is formed of a nitride film that is softer than the conventional device isolation structure such as a HDP oxide film. A thickness of the upper device isolation structure 419' ranges from about 50 Å to about 300 Å. As a result, the device isolation structure 420 in the NMOS region can relatively relieve the compressive stress applied to the semiconductor substrate 410 under the gate structure 497 in comparison with the device isolation structure of the HDP oxide film. Accordingly, the carrier mobility in the PMOS region and the NMOS region is simultaneously improved, thereby improving the operation characteristics of the transistor.

Figure 5A:
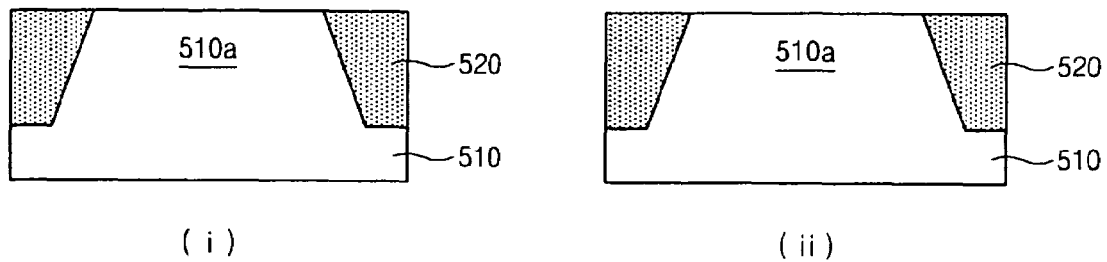
FIGS. 5a through 5f are simplified cross-sectional views illustrating a method for fabricating a semiconductor device according to another embodiment of the present invention.

FIGS. 5a through 5f are simplified cross-sectional views illustrating a method for fabricating a semiconductor device according to another embodiment of the present invention, wherein FIGS. 5a(i) through 5f(i) are cross-sectional views in the PMOS region and FIGS. 5a(ii) through 5f(ii) are cross-sectional views in the NMOS region. A trench (not shown) for device isolation is formed in a semiconductor substrate 510 having a pad insulating film (not shown). The semiconductor substrate 510 includes the PMOS region and the NMOS region. An insulating film (not shown) for device isolation is formed over an entire surface of the resultant (i.e. over the trench and the semiconductor substrate 510) to fill the trench for device isolation. The insulating film for device isolation is polished until the pad insulating film is exposed to form a device isolation structure 520 defining an active region 510a. In one embodiment of the present invention, the insulating film for device isolation is selected from the group consisting of a SOD oxide film, a HDP oxide film, and combination thereof. In order to improve the Gap-fill characteristics, the insulating film for device isolation includes a stacked structure of a SOD oxide film and a HDP oxide film. The SOD oxide film is formed by a Spin-fill method.

Figure 5B:
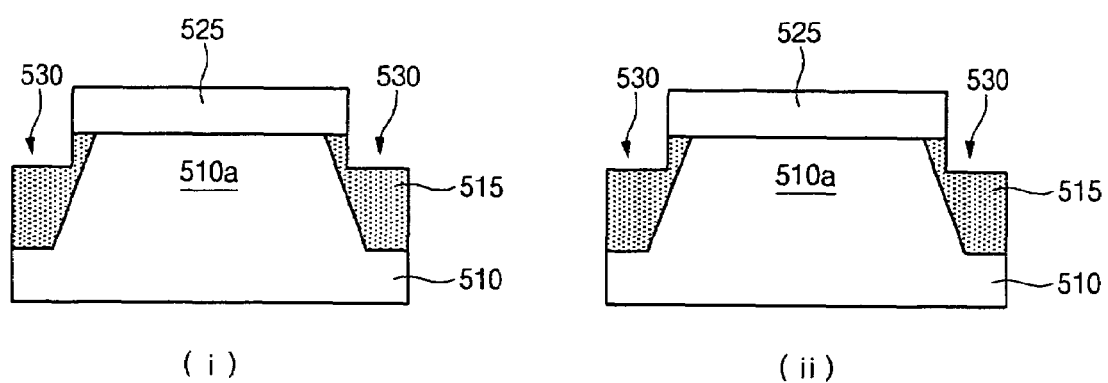
Figure 5C:
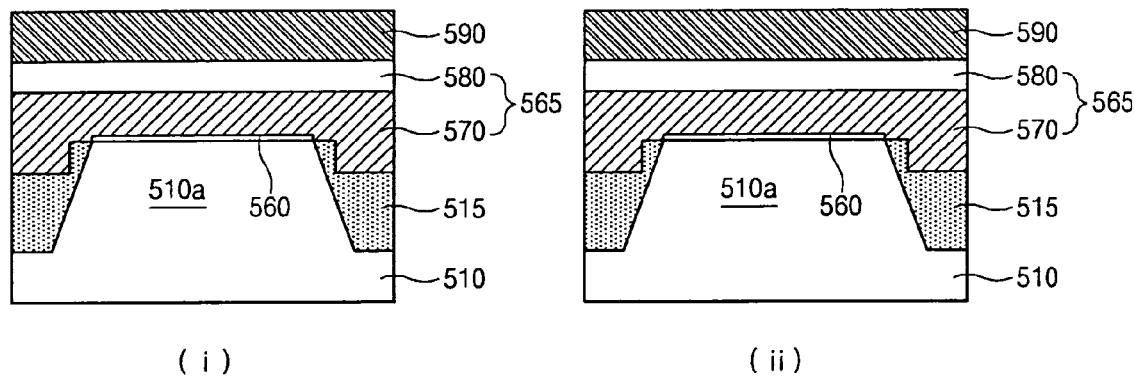

Referring to FIGS. 5b and 5c, a photoresist film (not shown) is formed over an entire surface of the resultant (i.e. over the active region 510a and the device isolation structure 520 in the PMOS region and the NMOS region). The photoresist film is exposed and developed using a recess mask (not shown) to form a photoresist film pattern 525 exposing a portion of the device isolation structure 520. A given thickness of the exposed device isolation structure 520 is etched using the photoresist film pattern 525 to form a recess 530 defining a lower device isolation structure 515. The photoresist film pattern 525 and the pad insulating film are removed to expose the semiconductor substrate 510. A gate insulating film 560 is formed over the exposed semiconductor substrate 510. A gate conductive layer 565 is formed over an entire surface of the resultant including the recess 530 (i.e. over the lower device isolation structure 515 and the gate insulating film 560). A gate hard mask layer 590 is formed over the gate conductive layer 565. In one embodiment of the present invention, the given thickness of the etched device isolation structure 520 ranges from about 10 Å to about 2,000 Å. In addition, the gate conductive layer 565 comprises a stacked structure of a lower gate conductive layer 570 and an upper gate conductive layer 580. The lower gate conductive layer 570 is formed of a polysilicon layer. The upper gate conductive layer 580 is selected from the group consisting of a titanium (Ti) layer, a titanium nitride (TiN) film, a tungsten (W) layer, an aluminum (Al) layer, a copper (Cu) layer, a tungsten silicide (WSi$_x$) layer, and combinations thereof. In another embodiment, the photoresist film pattern 525 is formed of a negative photoresist film.

Figure 5D:
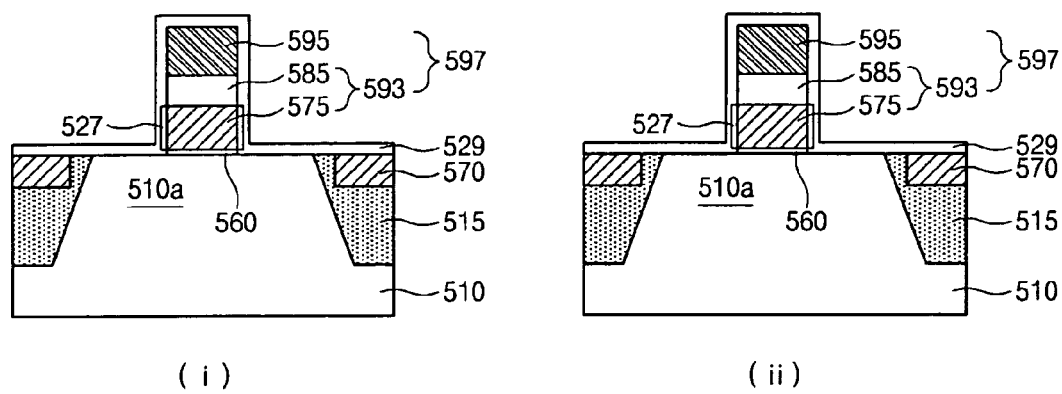

Referring to FIG. 5d, the gate hard mask layer 590 and the gate conductive layer 565 are patterned using a gate mask (not shown) to form a gate structure 597 including a stacked structure of a gate hard mask layer pattern 595 and a gate electrode 593. The gate electrode 593 includes a stacked structure of a lower gate electrode 575 and an upper gate electrode 585. During the formation process for the gate structure 597, the gate conductive layer 570 remains over the lower device isolation structure 515 to be separated from the gate electrode 593. Sidewalls of the gate electrode 593 are selectively oxidized to form an oxide film 527 on a sidewall of the lower gate electrode 575. An insulating film 529 is formed over an entire surface of the resultant (i.e. over the lower device isolation structure 515 and the semiconductor substrate 510 including the gate structure 597). In one embodiment of the present invention, the insulating film 529 is formed of a nitride film.

Figure 5E:
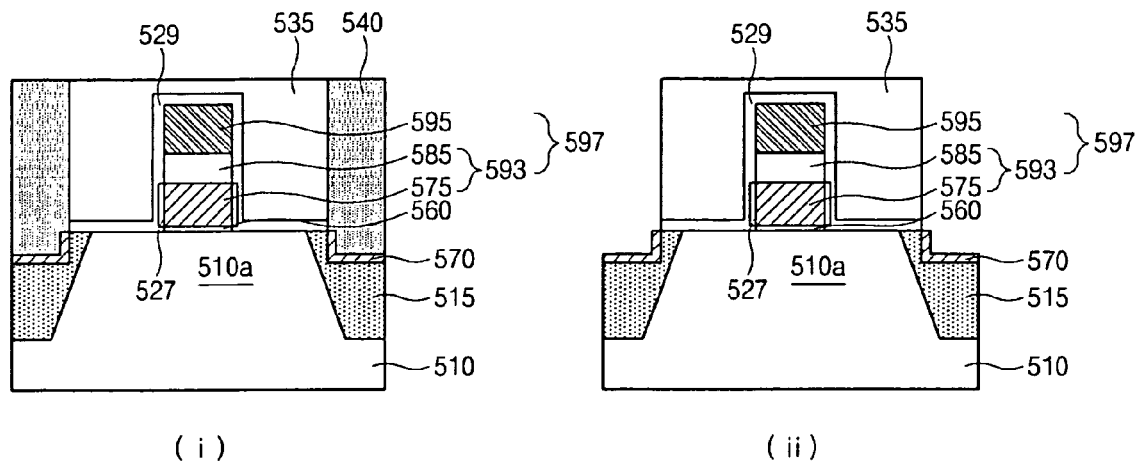
Figure 5F:
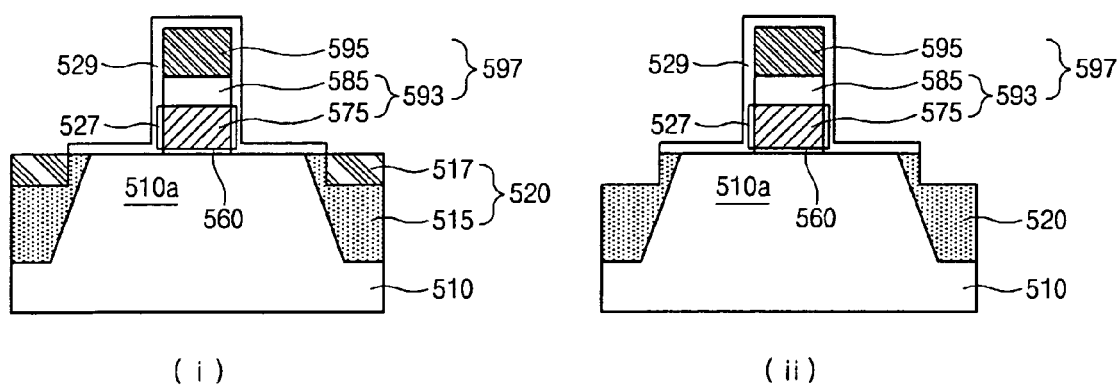

Referring to FIGS. 5e and 5f, a photoresist film (not shown) is formed over an entire surface of the resultant (i.e. over the semiconductor substrate 510 and the lower device isolation structure 515 in the PMOS region and the NMOS region). The photoresist film is exposed and developed using the recess mask to form a photoresist film pattern 535 covering the active region 510a and a portion of the device isolation structure 520 adjacent to the active region 510a. The exposed insulating film 529 is removed by the photoresist film pattern 535. A given thickness of the gate conductive layer 570 underlying the removed insulating film 529 is etched by the photoresist film pattern 535. A photoresist film pattern 540 is formed over the semiconductor substrate 510 to cover the PMOS region. The remaining gate conductive layer 570 in the NMOS region is removed. The photoresist film patterns 540 and 535 are removed. The remaining gate conductive layer 570 in the PMOS region is oxidized to form an upper device isolation structure 517 in the PMOS region. In one embodiment of the present invention, the upper device isolation structure 517 is formed of a poly-oxide film with increased volume to apply compressive stress provided from the upper device isolation structure 517 to the semiconductor substrate 510 under the gate structure 597. As a result of the compressive stress, the carrier mobility of the transistor is improved in the PMOS region. Thus, the operation characteristics of the transistor can be improved. In addition, since an upper portion of the device isolation structure 520 in the NMOS region is removed, the relatively small compressive stress of the device isolation structure in the NMOS region in comparison with the PMOS region is applied to the semiconductor substrate 510 under the gate structure 597. As a result, the carrier mobility of the transistor is improved in the NMOS region. Accordingly, the operation characteristics of the transistor can be simultaneously improved in both the PMOS region and the NMOS region.

In another embodiment of the present invention, the gate conductive layer over the lower device isolation structure in the PMOS region and the NMOS region is oxidized to form an upper device isolation structure. The upper device isolation structure in the NMOS region is removed. In the PMOS region, the relatively greater compressive stress is applied to the semiconductor substrate under the gate structure, while in the NMOS region, the relatively less compressive stress is applied to the semiconductor substrate under the gate structure. Accordingly, the operation characteristics of the transistor can be simultaneously improved in both the PMOS region and the NMOS region.

As described above, the device isolation structure is modified according to embodiments of the present invention to adjust the compressive stress applied to the semiconductor substrate under the gate structure. As a result, the carrier mobility of the device can be improved. That is, relatively large compressive stress and relatively small compressive stress are respectively applied to the PMOS transistor and the NMOS transistor, thereby improving the carrier mobility of the device. Accordingly, the operation characteristics of the device can be improved. In addition, void or seam, which may be formed during the formation of the device isolation structure, can be removed due to the further oxidizing process for the upper device isolation structure.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or in a non volatile memory device. Other additions, subtractions, or modifications are obvious in view of the present disclosure and are intended to fall within the scope of the appended claims.

What is claimed is:

1. A method for fabricating a semiconductor device comprising:
    forming a device isolation structure in a semiconductor substrate to define an active region;
    etching a given thickness of the device isolation structure to form a recess defining a lower device isolation structure having a first compressive stress;
    forming a gate conductive layer and a gate hard mask layer over the semiconductor substrate including the recess;
    patterning the gate hard mask layer and the gate conductive layer by using a gate mask to form a gate structure over the semiconductor substrate, wherein a given thickness of the gate conductive layer remains over the lower device isolation structure; and
    oxidizing the remaining gate conductive layer to form an upper device isolation structure having a second compressive stress greater than the first compressive stress.

2. The method according to claim 1, wherein the semiconductor substrate is in PMOS region.

3. The method according to claim 1, wherein the given thickness of the etched device isolation structure ranges from about 10 Å to about 2,000 Å.

4. The method according to claim 1, wherein the gate conductive layer includes a stacked structure of a lower gate conductive layer and an upper gate conductive layer.

5. The method according to claim 4, wherein the lower gate conductive layer includes a polysilicon layer.

6. The method according to claim 4, wherein the upper gate conductive layer is selected from the group consisting of a titanium (Ti) layer, a titanium nitride (TiN) film, a tungsten (W) layer, an aluminum (Al) layer, a copper (Cu) layer, a tungsten silicide (WSix) layer, and combinations thereof.

7. The method according to claim 1, wherein the upper device isolation structure is formed of a polyoxide film.

8. The method according to claim 1, wherein the lower device isolation structure is selected from the group consisting of a HDP oxide film, a SOD oxide film, and combination thereof.

9. The method according to claim 1, wherein the gate structure includes a stacked structure of a gate electrode and a gate hard mask layer pattern.

10. The method according to claim 1, further comprising oxidizing the upper device isolation structure to form increased volume of the upper device isolation structure.

11. The method according to claim 1, further comprising:
    removing the upper device isolation structure in the NMOS; and
    forming an insulating film over an entire surface of the resultant to form an upper device isolation structure in the NMOS region having a third compressive stress less than the first compressive stress.

12. The method according to claim 11, wherein the removing the upper device isolation structure includes:
    forming a photoresist film over an entire surface of the resultant;

exposing and developing the photoresist film by using a mask defining the device isolation structure in the PMOS region to form a photoresist film pattern;

removing the upper device isolation structure exposed by the photoresist film pattern; and removing the photoresist film pattern.

13. The method according to claim 11, wherein the insulating film is formed of a nitride film.

14. The method according to claim 11, wherein the upper device isolation structure in the PMOS region is formed of a poly-oxide film, the upper device isolation structure in the NMOS region is formed of a nitride film.

15. The method according to claim 11, wherein the lower device isolation structure is selected from the group consisting of a HDP oxide film, a SOD oxide film, and combination thereof.

16. The method according to claim 11, wherein the thickness of the upper device isolation structure in the NMOS region ranges from about 50 Å to about 300 Å.

17. A method for fabricating a semiconductor device comprising:

forming a device isolation structure in a semiconductor substrate having a PMOS region and a NMOS region to define an active region;

etching a given thickness of the device isolation structure to form a recess defining a lower device isolation structure having a first compressive stress;

forming a gate conductive layer and a gate hard mask layer over the semiconductor substrate including the recess;

patterning the gate hard mask layer and the gate conductive layer by using a gate mask to form a gate structure over the semiconductor substrate, wherein the gate conductive layer remains over the lower device isolation structure;

etching a given thickness of the remaining gate conductive layer over the lower device isolation structure; and oxidizing the gate conductive layer over the lower device isolation structure to form an upper device isolation structure in the PMOS region having a second compressive stress greater than the first compressive stress.

18. The method according to claim 17, wherein the etching the given thickness of the device isolation structure includes:

forming a photoresist film over an entire surface of the resultant;

exposing and developing the photoresist film by using a recess mask to form a photoresist film pattern covering the active region and a portion of the device isolation structure adjacent to the active region;

etching a given thickness of the device isolation structure by the photoresist film pattern to form a recess defining a lower device isolation structure having a first compressive stress; and removing the photoresist film pattern.

19. The method according to claim 18, wherein the given thickness of the etched device isolation structure ranges from about 10 Å to about 2,000 Å.

20. The method according to claim 17, wherein the gate conductive layer includes a stacked structure of a lower gate conductive layer and an upper gate conductive layer.

21. The method according to claim 20, wherein the lower gate conductive layer includes a polysilicon layer.

22. The method according to claim 20, wherein the upper gate conductive layer is selected from the group consisting of a titanium (Ti) layer, a titanium nitride (TiN) film, a tungsten (W) layer, an aluminum (Al) layer, a copper (Cu) layer, a tungsten silicide (WSix) layer, and combinations thereof.

23. The method according to claim 17, wherein the etching the given thickness of the gate conductive layer includes:

forming a photoresist film over an entire surface of the resultant;

exposing and developing the photoresist film by using a recess mask to form a photoresist film pattern covering the active region and a portion of the device isolation structure adjacent to the active region;

etching a given thickness of the gate conductive layer over the lower device isolation structure by the photoresist film pattern; and removing the photoresist film pattern.

24. The method according to claim 17, wherein the upper device isolation structure is formed of a polyoxide film.

25. The method according to claim 17, wherein the lower device isolation structure is selected from the group consisting of a HDP oxide film, a SOD oxide film, and combination thereof.

26. The method according to claim 17, wherein the oxidizing the gate conductive layer includes:

forming a photoresist film pattern over an entire surface of the resultant to cover the PMOS region and a portion of the NMOS region, wherein the portion of the NMOS region includes the active region and a portion of the device isolation structure adjacent to the active region;

removing the gate conductive layer in the NMOS region by the photoresist film pattern;

removing the photoresist film pattern; and oxidizing the gate conductive layer over the lower device isolation structure in the PMOS region to form an upper device isolation structure having a second compressive stress.

27. The method according to claim 17, wherein the oxidizing the gate conductive layer includes:

oxidizing the gate conductive layer over the lower device isolation structure to form an upper device isolation structure having a second compressive stress;

forming a photoresist film pattern covering the PMOS region;

removing the upper device isolation structure in the NMOS region by using the photoresist film pattern; and removing the photoresist film pattern.

28. The method according to claim 17, further comprising forming a gate insulating film at the interface of the gate structure and the semiconductor substrate.

29. The method according to claim 17, wherein the gate structure includes a stacked structure of a gate electrode and a gate hard mask layer pattern.

30. The method according to claim 29, further comprising oxidizing a sidewall of the gate electrode.

31. The method according to claim 17, further comprising forming an insulating film over the semiconductor substrate including the gate structure.

32. The method according to claim 31, wherein the insulating film is formed of a nitride film.

* * * * *